United States Patent
Hachigo et al.

(10) Patent No.: US 7,569,493 B2
(45) Date of Patent: Aug. 4, 2009

(54) NITRIDE-BASED COMPOUND SEMICONDUCTOR, METHOD OF CLEANING A COMPOUND SEMICONDUCTOR, METHOD OF PRODUCING THE SAME, AND SUBSTRATE

(75) Inventors: Akihiro Hachigo, Itami (JP); Takayuki Nishiura, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 221 days.

(21) Appl. No.: 11/435,129

(22) Filed: May 17, 2006

(65) Prior Publication Data

US 2006/0264011 A1 Nov. 23, 2006

(30) Foreign Application Priority Data

May 17, 2005 (JP) ............................. 2005-144101
Mar. 7, 2006 (JP) ............................. 2006-060999

(51) Int. Cl.
  *H01L 21/31* (2006.01)
  *H01L 21/469* (2006.01)

(52) U.S. Cl. ...................... 438/759; 438/752; 257/615; 257/E21.22; 257/E33.028

(58) Field of Classification Search ................. 438/759, 438/746, 906, 93, 752, 747, 498; 257/189, 257/615, 616, E33.023, E33.025, E33.026, 257/E21.22, E21.221, E21.223, E21.224, 257/E33.028, E33.002

See application file for complete search history.

(56) References Cited

U.S. PATENT DOCUMENTS

| | | | | |
|---|---|---|---|---|
| 5,676,760 A | * | 10/1997 | Aoki et al. | .................... 134/1.3 |
| 6,029,679 A | | 2/2000 | Ota et al. | |
| 6,146,467 A | | 11/2000 | Takaishi et al. | |
| 6,730,644 B1 | | 5/2004 | Ishikawa et al. | |
| 2001/0021572 A1 | * | 9/2001 | Orita et al. | .................. 438/478 |
| 2001/0025017 A1 | | 9/2001 | Amemiya et al. | |
| 2002/0050279 A1 | * | 5/2002 | Bergman | ........................ 134/3 |
| 2003/0082893 A1 | * | 5/2003 | Matsumoto et al. | ......... 438/522 |
| 2006/0029832 A1 | * | 2/2006 | Xu et al. | ..................... 428/698 |
| 2007/0207710 A1 | * | 9/2007 | Montierth et al. | ............. 451/56 |
| 2007/0256705 A1 | * | 11/2007 | Abbadie et al. | ................ 134/3 |

FOREIGN PATENT DOCUMENTS

CN 1250224 A 4/2000

(Continued)

OTHER PUBLICATIONS

Kern, Werner, "The Evolution of Silicon Wafer Cleaning Technology", Journal of the Electrochemical Society, vol. 137, No. 6, Jun. 1990, pp. 1887-1892.*

(Continued)

*Primary Examiner*—Caridad M Everhart
(74) *Attorney, Agent, or Firm*—McDermott Will & Emery LLP

(57) ABSTRACT

There is provided a cleaning method and production method that suppresses the adhesion of foreign matters including impurity, fine particles and the like on a surface of a compound semiconductor. A method of cleaning a nitride-based compound semiconductor in accordance with the present invention includes the steps of: preparing a nitride-based compound semiconductor (or a substrate preparation step); and cleaning. In the step of cleaning, a cleaning liquid having a pH of 7.1 or higher is used to clean the nitride-based compound semiconductor.

44 Claims, 5 Drawing Sheets

FOREIGN PATENT DOCUMENTS

| CN | 1271000 | | 10/2000 |
|---|---|---|---|
| CN | 1395322 | A | 2/2003 |
| EP | 1 389 496 | A1 | 2/2004 |
| GB | 2 287 827 | A | 9/1995 |
| JP | 2003-008060 | A | 1/2003 |
| TW | 425314 | B | 3/2001 |
| WO | WO 02/01609 | A2 | 1/2002 |
| WO | WO 2005/041283 | A1 | 5/2005 |

OTHER PUBLICATIONS

Hattori, Tsuyoshi: "Techniques Employed to Clean Surface of Silicon Wafer, New Edition," Realize Co., 2000, p. 394.

European Search Report issued in European Patent Application No. EP 06 01 0084, mailed Jul. 10, 2008.

Kern, W., et al., "Cleaning Solutions Based on Hydrogen Peroxide for use in Silicon Semiconductor Technology", RCA Review, Jun. 1970, pp. 187-206.

Sawafuji, Y., et al., "AlxGa1-xAs (111)A substrate with atomically flat polished surface", Journal of the Electrochemical Society, Nov. 1999, vol. 146.

European Search Report issued in European Patent Application No. EP 06010084.9-1235/1724821, mailed on Sep. 30, 2008.

Kern, Werner, et al., "Handbook of Semiconductor Wafer Cleaning Technology," Noyes Publications, 1993, pp. 167-187.

Chen, Zhan et al., "Mechanism of Particle Deposition of Silicon Surface during Dilute HF Cleans," Journal of the Electrochemical Society, vol. 150, No. 11, 2003, pp. G667-G672.

Wang, Y. L. et al., "A modified multi-chemicals spray cleaning process for post CMP cleaning application," Materials Chemistry and Physics, vol. 52, 1998, pp. 23-30.

Itano, M. et al., Minimization of Particle Contamination during Wet Processing of Si Wafers, Journal of the Electrochemical Society, vol. 142, No. 3, Mar. 1995, pp. 971-978.

Negri, Fabienne, et al., "Improved surface treatments for recycled (100) GaAs substrates in view of molecular-beam epitaxy growth: Auger electron spectroscopy, Raman, and secondary ion mass spectrometry analyses," Journal of Vacuum Science and Technology B, vol. 20, No. 6, 2002, pp. 2214-2218.

Kern, W. et al., "Handbook of Semiconductor Wafer Cleaning Technology," Noyes Publications, 1993, pp. 141-142.

Chinese Office Action, with English Translation, issued in Chinese Patent Application No. CN 200610081873.5, issued on Mar. 7, 2008.

\* cited by examiner

NITRIDE-BASED COMPOUND SEMICONDUCTOR, METHOD OF CLEANING A COMPOUND SEMICONDUCTOR, METHOD OF PRODUCING THE SAME, AND SUBSTRATE

BACKGROUND OF THE INVENTION

1. Field of the Invention

The present invention relates generally to nitride-based compound semiconductors, methods of cleaning compound semiconductors, methods of producing the same and substrates, and particularly to nitride-based compound semiconductors, methods of cleaning compound semiconductors, methods of producing the same and substrates, that can provide excellent cleanness on a surface having been cleaned.

2. Description of the Background Art

Nitride-based compound semiconductor, one example of compound conductors, has a large bandgap and is of direct transition type. As such, it is in practical use in light emitting diodes, semiconductor lasers and the like and is also being studied for application to power devices and the like. These devices employ a structure including a substrate and thin, nitride-based compound semiconductor films deposited on the substrate in layers.

Such thin, nitride-based compound semiconductor films are deposited on a substrate formed for example of gallium nitride (GaN) as well as sapphire, silicon carbide (SiC), silicon (Si), zinc oxide (ZnO), gallium arsenide (GaAs) and the like, and in the method of producing the nitride-based compound semiconductor, providing thin, nitride-based compound semiconductor films of high quality entails removing impurity on a surface of the substrate, for example as described in Japanese Patent Laying-Open No. 2003-8060.

Furthermore, after the substrate is provided thereon with a thin, gallium nitride-based compound semiconductor film, an electrode is formed on the thin film to supply the thin film with a current. In that case, that surface of the thin film on which the electrode is deposited must be cleaned to provide closer contact between the electrode and the thin film and provide a device with an improved characteristic. Accordingly, before the electrode is formed, the thin film can have the surface cleaned.

Typically, semiconductor is cleaned with an organic solvent, pure water, an acidic solution, an alkaline aqueous solution or the like, or a combination of any thereof. Si and similar, conventional semiconductors are typically RCA-cleaned, for example as described in "Techniques Employed to Clean Surface of Silicon Wafer, New Edition", edited by Tsuyoshi Hattori, Realize Co., 2000, p. 394. RCA cleaning is done by alkaline cleaning with a cleaning liquid based on ammonium, pure water cleaning, acidic cleaning employing a hydrochloric acid-containing solution, and hydrofluoric acid cleaning for removing an oxide on a surface, in combination, and is a cleaning method combining the acidic cleaning, the alkaline cleaning and the like together as they specialize in removing different types of fine particles, respectively. Thus RCA cleaning combining the above described, plurality of types of cleaning techniques is intended to remove any impurities. The hydrochloric acid-containing solution can be replaced with a sulfuric acid-containing solution to clean the semiconductor. Furthermore, before RCA cleaning, or to remove an organic matter in a subsequent step, organic cleaning employing an organic solvent is also generally performed.

The above described cleaning techniques can also be applied to clean nitride-based compound semiconductor. The nitride-based compound semiconductor thus cleaned, however, conventionally, disadvantageously had fine particles adhering on a surface thereof. For example, when a surface of a nitride-based compound semiconductor cleaned with an organic solvent to remove an organic matter or with an acidic solution to remove metallic impurity or the like is compared with that of a generally known, silicon or similar substrate similarly cleaned, it has been confirmed that the former has more fine particles adhering thereon than the latter. Furthermore, in some case, the nitride-based compound semiconductor had a surface with a larger, rather than smaller, number of fine particles adhering thereon after it is cleaned than before it is cleaned.

Thus applying conventional cleaning techniques to nitride-based compound semiconductor results in the cleaned semiconductor having a surface with fine particles adhering thereon. As such, it is difficult to exactly apply the conventional cleaning techniques to cleaning a surface of nitride-based compound semiconductor. Cleaning compound semiconductors other than nitride-based compound semiconductor, such as InP, GaAs and the like, is also accompanied by a similar problem.

SUMMARY OF THE INVENTION

The present invention contemplates a cleaning method and production method that can suppress the adhesion of impurities, fine particles and other similar foreign matters on a surface of nitride-based compound semiconductor and those of other similar compound semiconductors.

The present invention also contemplates a substrate formed of compound semiconductor that can suppress the adhesion of foreign matters thereon and have an excellent surface property.

A method of cleaning a nitride-based compound semiconductor in accordance with the present invention includes the steps of: preparing a nitride-based compound semiconductor; and cleaning the nitride-based compound semiconductor with a cleaning liquid having a pH of at least 7.1.

A method of producing a nitride-based compound semiconductor in accordance with the present invention includes the steps of: performing the method of cleaning a nitride-based compound semiconductor, as described above; and after the step of performing the method of cleaning, performing a process to deposit a film on the nitride-based compound semiconductor.

A method of cleaning a compound semiconductor in accordance with the present invention includes the steps of: preparing a compound semiconductor; and cleaning the compound semiconductor with a cleaning liquid. The cleaning liquid is adjusted to allow fine particles identical in material to the compound semiconductor to have a zeta potential smaller than zero such that the fine particles are contained in the cleaning liquid.

A method of cleaning a compound semiconductor in accordance with the present invention includes the steps of: preparing a compound semiconductor formed of InP; and cleaning the compound semiconductor with a cleaning liquid having a pH of at least 7.1.

A method of cleaning a compound semiconductor in accordance with the present invention includes the steps of: preparing a compound semiconductor formed of GaAs; and cleaning the compound semiconductor with a cleaning liquid having a pH of at least 5.7.

A method of cleaning a compound semiconductor in accordance with the present invention includes the steps of: preparing a compound semiconductor; and cleaning the compound semiconductor with a cleaning liquid. In the step of cleaning, the compound semiconductor is cleaned with the cleaning liquid vibrated. The cleaning liquid is adjusted to allow fine particles identical in material to the compound semiconductor to have a zeta potential falling within a range of −15 mV to +15 mV, both inclusive, such that the fine particles are contained in the cleaning liquid.

A method of cleaning a compound semiconductor in accordance with the present invention includes the steps of: preparing a compound semiconductor; cleaning; and rinsing. In the cleaning step a cleaning liquid is used to clean the compound semiconductor. In the rinsing step, which is performed after the step of cleaning, a rinsing liquid adjusted to have a pH of at least 6.5 and at most 7.5 and vibrated is used to rinse a surface of the compound semiconductor The rinsing liquid is one selected from pure water, electrolyzed ion water, and a solution having gas, liquid and/or the like added thereto A method of producing a compound semiconductor in accordance with the present invention includes the steps of: performing the method of cleaning a compound semiconductor, as described above; and after the step of performing the method of cleaning, performing a process to deposit a film on the compound semiconductor.

A substrate in accordance with the present invention is a substrate that is formed of a compound semiconductor cleaned in the method of cleaning a compound semiconductor, as described above, had has a surface roughness in Ra (an arithmetic mean roughness as defined in JIS B0601) of at most 2 nm.

Thus the present invention can suppress the adhesion of fine particles on a surface of a compound semiconductor such as nitride-based compound semiconductor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter reference will be made to the drawings to describe the embodiments and examples of the present invention. Note that in the figures, identical or corresponding portions are identically denoted and will not be described repeatedly.

First Embodiment

Figure 1:
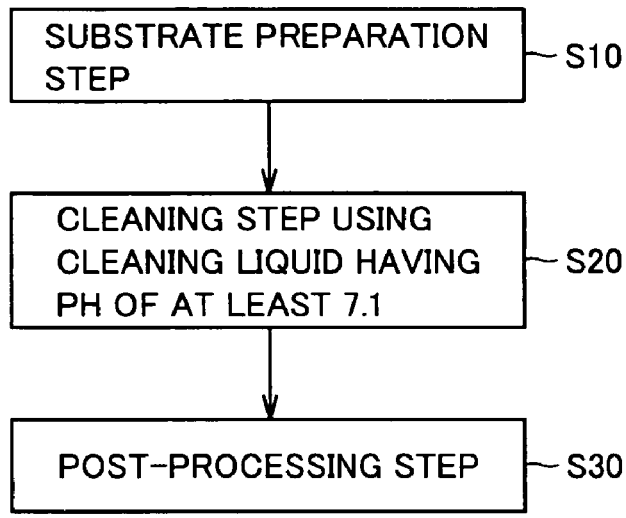
FIG. 1 is a flow chart representing a first embodiment of a method of producing a nitride-based compound semiconductor in accordance with the present invention.

Reference will be made to FIG. 1 to describe a first embodiment of a method of producing a nitride-based compound semiconductor in accordance with the present invention.

As shown in FIG. 1, in the present method of producing a nitride-based compound semiconductor in the first embodiment, a substrate preparation step (S10) is initially performed to prepare a substrate formed of nitride-based compound semiconductor. The substrate to be prepared may be of bulk crystal. For example, it may be a thin film deposited on a substrate formed of bulk crystal or the like.

Then a cleaning step (S20) is performed with a cleaning liquid having a pH of 7.1 or higher. The cleaning liquid may be any liquid that has the pH of 7.1 or higher. For example, it may be an alkaline solution. The cleaning step (520) can thus reduce the number of fine particles on a surface of the thus cleaned substrate to be effectively smaller than conventional. The substrate preparation step (S10) and the cleaning step (S20) configure a method of cleaning a nitride-based compound semiconductor in accordance with the present invention.

The substrate having undergone the cleaning step (S20) then undergoes a post-processing step (S30) for example to deposit a predetermined film on a surface of the substrate formed of the nitride-based compound semiconductor. Then on a surface of the substrate a predetermined film is deposited and furthermore an electrode and other features are provided. Note that preferably on the substrate a plurality of elements are formed. In that case, after a predetermined feature is provided on a surface of the substrate, for example dicing or a similar division step is performed to divide the substrate into discrete devices. A device employing nitride-based compound semiconductor can thus be obtained. Such device is mounted for example on a lead frame and can for example be wire-bonded to provide a semiconductor device employing the element.

Second Embodiment

Figure 2:
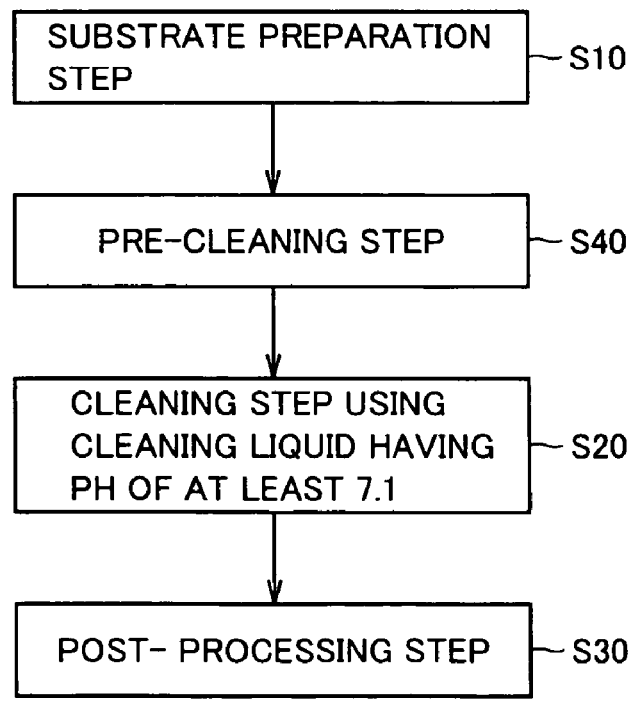
FIG. 2 is a flow chart representing a second embodiment of the method of producing a nitride-based compound semiconductor in accordance with the present invention.

Reference will be made to FIG. 2 to describe a second embodiment of the method of producing a nitride-based compound semiconductor in accordance with the present invention.

As shown in FIG. 2, the present method of producing a nitride-based compound semiconductor, as described in the second embodiment, is basically similar in configuration to that described in the first embodiment with reference to FIG. 1, except that the method shown in FIG. 2 differs from that shown in FIG. 1 in that before the cleaning step (S20) a pre-cleaning step (S40) is performed. In the pre-cleaning step (S40) any method can be used to remove impurity on a surface of a substrate formed of nitride-based compound semiconductor. For example the pre-cleaning step (S40) may be a cleaning step using pure water, an organic solvent, an acidic solution, electrolyzed ion water, an alkaline solution or the like as a cleaning liquid. Alternatively, the pre-cleaning step (S40) may be a cleaning step without using a cleaning liquid, such as ultra-violet ozone cleaning or a similar dry cleaning step. A variety of cleaning steps can thus be performed as the pre-cleaning step (S40) to effectively remove a plurality of types of impurities such as inorganic impurity, organic impurity and the like adhering on a surface of a substrate formed of nitride-based compound semiconductor.

Figure 3:
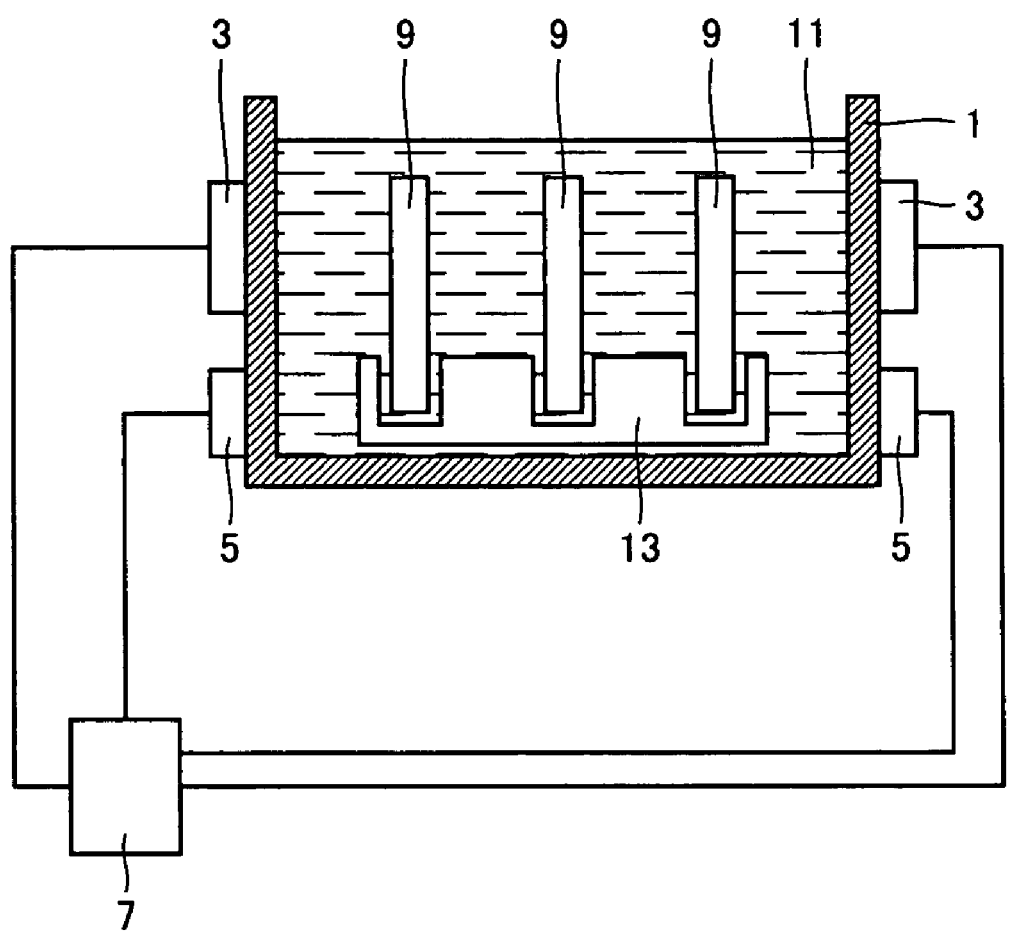
FIG. 3 is a schematic cross section of a cleaning apparatus used in a cleaning step, or a pre-cleaning step.

Furthermore in the above described cleaning step (S20) and pre-cleaning step (S40) such a cleaning apparatus as shown in FIG. 3 may for example be used to vibrate (or shake) or heat the cleaning liquid. With reference to FIG. 3, a cleaning apparatus will be described that is used in the method of producing a nitride-based compound semiconductor in accordance with the present invention.

As shown in FIG. 3, the cleaning apparatus includes a cleaning bath 1 for holding a cleaning liquid 11, an ultrasonic wave generating member 3 and a heating member 5 arranged on a sidewall of cleaning bath 1, and a controller 7 connected to ultrasonic wave generating member 3 and heating member 5. to control ultrasonic wave generating member 3 and heating member 5. Cleaning bath 1 internally holds cleaning liquid 11. Furthermore in cleaning liquid 11 is immersed a holder 13 holding a plurality of substrates 9. More specifically, holder 13 holds the plurality of substrates 9 that are formed of nitride-based compound semiconductor and to be cleaned. Cleaning bath 1 has a sidewall with an upper portion having ultrasonic wave generating member 3 arranged thereon, and a lower portion having heating member 5 arranged thereon.

When the cleaning step (S20) or the pre-cleaning step (S40) is performed to clean substrates, cleaning liquid 11 as predetermined is introduced in cleaning bath 1 and substrates 9 held by holder 13 are immersed in cleaning liquid 11 together with holder 13, as shown in FIG. 3. Substrates 9 can thus have their surfaces cleaned with cleaning liquid 11.

Furthermore, while the substrates are thus cleaned, ultrasonic wave generating member 3 may be controlled by controller 7 to generate an ultrasonic wave. As a result, the ultrasonic wave is applied to and thus vibrates cleaning liquid 11 to more effectively remove impurity, fine particles and the like on substrate 9. Furthermore, cleaning bath 1 may be arranged on an X-Y stage or a similar member that can be swung. The member may be swung to vibrate cleaning bath 1 to agitate (or shake) cleaning liquid 11 held therein. Alternatively, substrates 9 may be swung together with the holder 13 manually or the like to agitate (or shake) cleaning liquid 11.

This, as well as applying an ultrasonic wave, can more effectively remove impurity, fine particles and the like on substrate 9. Furthermore, heating member 5 employing an electro-thermal heater or the like may be controlled by controller 7 to heat cleaning liquid 11. This can increase cleaning liquid 11 in temperature and thus furthermore effectively remove impurity, fine particles and the like on substrate 9. Note that applying an ultrasonic wave by ultrasonic wave generating member 3 (or vibrating cleaning liquid 11), and heating by heating member 5, as described above, may be done simultaneously or separately.

Third Embodiment

Figure 4:
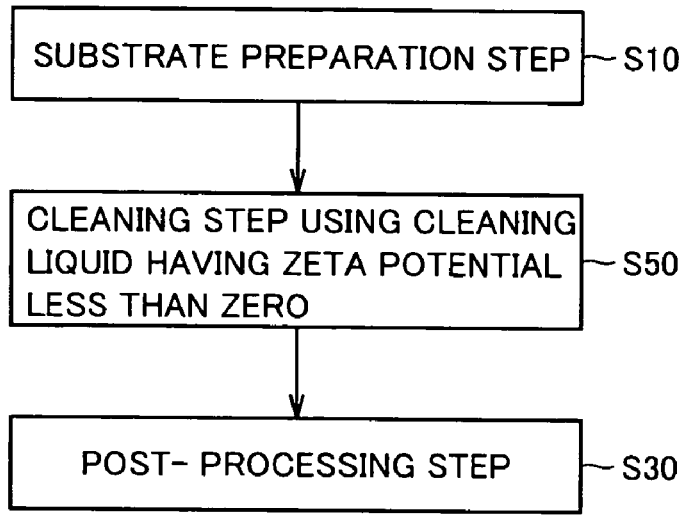
FIGS. 4-7 are flow charts representing third to sixth embodiments of a method of producing a compound semiconductor in accordance with the present invention.

With reference to FIG. 4 will be described a method of producing a compound semiconductor in accordance with the present invention in a third embodiment.

As shown in FIG. 4, the present method of producing a compound semiconductor, described in the third embodiment, is basically similar in configuration to that described in the first embodiment with reference to FIG. 1, except that the substrate preparation step (S10) of FIG. 4 is not limited to preparing a nitride-based compound semiconductor; it may be preparing any substrate that is formed of a compound semiconductor, such as substrates formed of InP, GaAs, and the like.

Furthermore in the method shown in FIG. 4 the substrate preparation step (S10) is followed by a cleaning step (S50) using a cleaning liquid having a zeta potential less than zero. More specifically in this step (S50) a compound semiconductor is cleaned with a cleaning liquid that is adjusted to allow fine particles identical in material to the substrate (i.e., a compound semiconductor) to have a zeta potential smaller than zero such that the fine particles are contained in the cleaning liquid. Note that zeta potential is a potential caused at a surface of a fine particle when the fine particle is present in a liquid. More specifically, at an interface of a solid and a liquid that contact each other, an electric double layer results and an electrokinetic potential is caused, and when along the interface the two layers have relative motion, there appears a potential difference varying with the distance from the interface, and zeta potential means a potential provided at a slip plane, i.e., a surface of a fixed layer corresponding to the thickness provided by the molecules of a liquid layer absorbed on the interface.

Using a cleaning liquid having a zeta potential adjusted to be less than zero in the cleaning step (S50) to clean a substrate can reduce the number of fine particles on a surface of the substrate to be effectively smaller than conventional. Note that the cleaning liquid may have its zeta potential adjusted for example by adjusting the cleaning liquid in pH. Furthermore, the type of the cleaning liquid used can be selected as appropriate to match a material forming a substrate to be cleaned, a type of foreign matters (fine particles and the like) to be removed, and the like. For example, for a substrate formed of a compound semiconductor of InP or GaN, a cleaning liquid that has a pH set to be 7.1 or higher is used to allow fine particles formed of InP or GaN to have a zeta potential of less than zero such that the fine particles are contained in the cleaning liquid. Furthermore, for a substrate formed of a compound semiconductor of GaAs, a cleaning liquid that has a pH set to be 5.7 or higher is used to allow fine particles formed of GaAs to have a zeta potential of less than zero such that the fine particles are contained in the cleaning liquid.

The cleaning liquid can be measured for pH with a pH electrometer. For example, a glass electrode is used as an electrode and immersed in a cleaning liquid to be measured, and another glass electrode is immersed in a solution serving as a reference adjusted to have a pH of 7. The difference in potential from the solution serving as the reference can be measured to obtain the pH of the cleaning liquid. Note that the pH electrometer is calibrated with standard calibration liquids of a pH of 4 and a pH of 9. After the pH measurement, the electrode has a tip (i.e., a portion immersed in the cleaning liquid and the like) exposed to a stream of distilled water having a pH of 6.7 to wash away the cleaning liquid and the like adhering on a surface of the tip of the electrode, and when the pH electrometer indicates a pH of 6.7 with the tip exposed to the stream of distilled water, a subsequent measurement is started.

Furthermore in the method shown in FIG. 4 the cleaning step (S50) is followed by a post-processing step (S30), similarly as done in the method shown in FIG. 1. As a result an element employing a compound semiconductor and a semiconductor device employing the same can be obtained.

Note that zeta potential varies depending on a combination of a cleaning liquid (a liquid) and fine particles (or a solid) contained in that liquid, and there are several types of methods known to measure zeta potential. One such method is that an electric field is externally applied to charged particles (fine particles) dispersed typically in a liquid (or a solution) to obtain zeta potential from the intensity of the electric field and the mobility of the charged particles in the liquid. The mobility of the charged particles is measured for example with a microscope to observe the movement of the fine particles or by. utilizing Doppler effect of laser light to accurately measure the mobility of the charged particles.

Furthermore, in measuring a zeta potential for a solution, it is preferable that the solution contain fine particles having a size of a few µm or smaller (preferably 3 µm or smaller) in diameter, since if the fine particles are increased in size for example to have a diameter of several tens µm or larger, the zeta potential can also be affected by the geometry of the fine particles. Sufficiently reducing fine particles in size, as described above, can sufficiently reduce an effect of the geometry of the fine particles on zeta potential.

Fourth Embodiment

With reference to FIG. will be described a method of producing a compound semiconductor in accordance with the present invention in a fourth embodiment.

Figure 5:
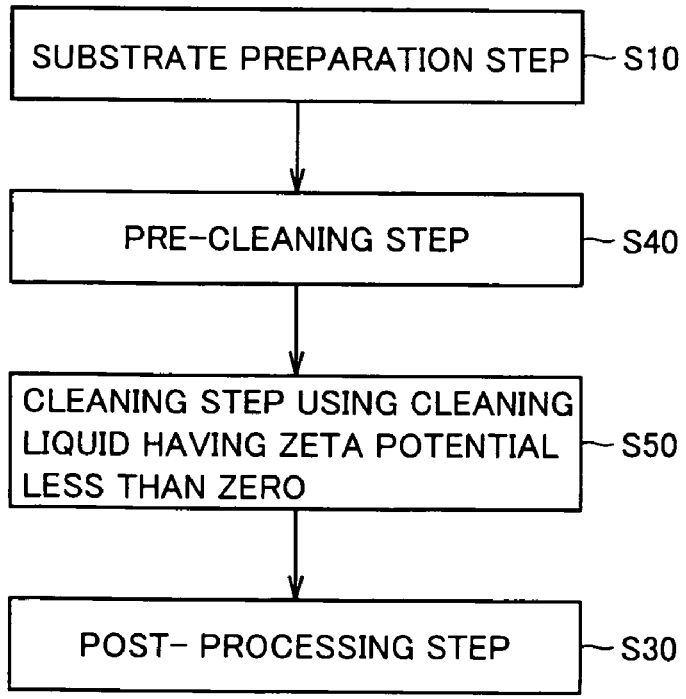

As shown in FIG. 5, the present method of producing a compound semiconductor, as described in the fourth embodiment, is basically similar in configuration to that described in the third embodiment with reference to FIG. 4, except that the method shown in FIG. 5 differs from that shown in FIG. 4 in that the pre-cleaning step (S40) is performed prior to a cleaning step (S50). In the pre-cleaning step (S40), as well as that shown in FIG. 2, any technique can be used to remove impurity on a surface of a substrate formed of compound semiconductor. The cleaning step thus performed can effectively remove a plurality of types of impurities such as inorganic impurity, organic impurity and the like adhering on a surface of a substrate formed of compound semiconductor.

Furthermore in the above described cleaning step (S50) and pre-cleaning step (S40) such a cleaning apparatus as shown in FIG. 3 may for example be used to vibrate (or shake) or heat a cleaning liquid. This can help to remove fine particles and the like on a substrate in the cleaning step (S50) and the pre-cleaning step (S40) and hence clean the substrate furthermore efficiently.

Fifth Embodiment

Figure 6:
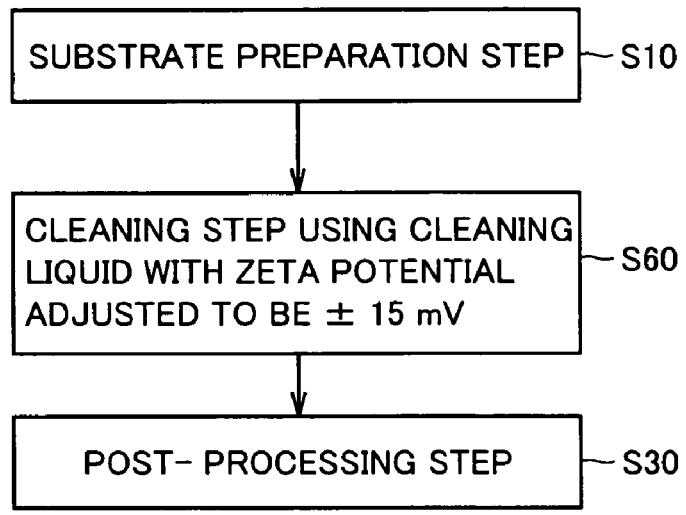

With reference to FIG. 6 will be described a method of producing a compound semiconductor in accordance with the present invention in a fifth embodiment.

As shown in FIG. 6, the present method of producing a compound semiconductor, as described in the fifth embodiment, is basically similar in configuration to that described in the third embodiment with reference to FIG. 4, except that in the method shown in FIG. 6 the substrate preparation step (S10) is followed by a cleaning step (S60) using a cleaning liquid having a zeta potential adjusted to fall within a range of ±15 mV (or have an absolute value of 15 mV or smaller). The cleaning step (S60) is performed with a cleaning liquid that is adjusted to allow fine particles formed of the same material(s) as the material(s) (i.e., a compound semiconductor) forming a substrate prepared in the substrate preparation step (S10) to have a zeta potential falling within a range of at least −15 mV to at most +15 mV such that the fine particles are contained in the cleaning liquid. Such a value in zeta potential can be obtained for example by adjusting the cleaning liquid in pH. For example, for a substrate formed of GaN or InP, adjusting the cleaning liquid to have a pH of at least 6.5 and at most 7.5, more preferably at least 6.7 and at most 7.3 can provide the zeta potential as described above. For a substrate formed GaAs, adjusting the cleaning liquid to have a pH of at least 4.0 and at most 7.0, more preferably at least 4.5 and at most 6.5 can provide the zeta potential as described above.

Furthermore in the cleaning step (S60) the substrate is cleaned with the cleaning. liquid vibrated. If in a cleaning liquid fine particles have a zeta potential relatively small in absolute value, even a small variation in a condition in cleaning a substrate varies the zeta potential in sign and the fine particles more readily adhere to the substrate. Vibrating the cleaning liquid in the cleaning step (560) to clean a substrate can effectively suppress the adhesion of fine particles on a surface of the thus cleaned substrate.

Sixth Embodiment

Figure 7:
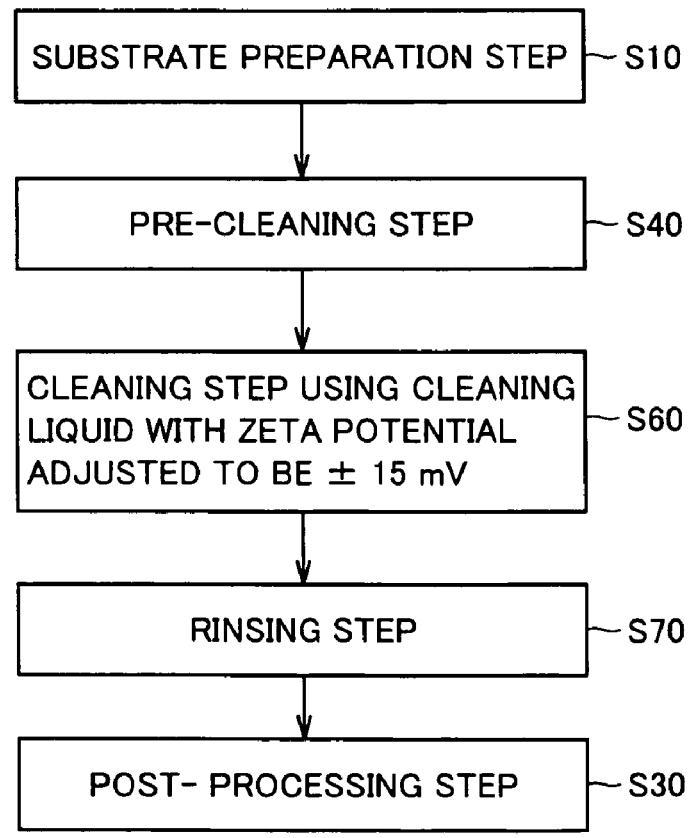

With reference to FIG. 7 will be described a method of producing a compound semiconductor in accordance with the present invention in a sixth embodiment.

As shown in FIG. 7, the present method of producing a compound semiconductor, as described in the sixth embodiment, is basically similar in configuration to that described in the fifth embodiment with reference to FIG. 6, except that the method shown in FIG. 7 differs from that shown in FIG. 6 in that a pre-cleaning step (S40) is performed prior to the cleaning step (S50) and that a rinsing step (S70) is performed after the cleaning step (S50) and before the post-processing step (S30).

In the pre-cleaning step (S40), as well as that shown in FIG. 2, any technique can be used to remove impurity on a surface of a substrate formed of compound semiconductor. The cleaning step (S40) thus performed can effectively remove a plurality of types of impurities such as inorganic impurity, organic impurity and the like adhering on the surface of the substrate formed of compound semiconductor.

Furthermore in the rinsing step (70) a rinsing liquid adjusted to have a pH of at least 6.5 and at most 7.5, more preferably at least 6.7 and at most 7.3 is used to rinse the surface of the substrate. Furthermore, in doing so, the rinsing liquid is vibrated and thus used to rinse the surface of the substrate formed of compound semiconductor. Note that the rinsing liquid can be selected, as appropriate, depending on the material(s) of the substrate, the type of the cleaning liquid used in the cleaning step (S60), and the like. Furthermore, the rinsing liquid may be any one selected from solutions having pure water, electrolyzed ion water, gas, liquid (an agent, a cleaning liquid) and/or other similar additive added thereto.

Furthermore the cleaning step (S50), the pre-cleaning step (S40) and the rinsing step (S70) may be performed with a cleaning apparatus, such as shown in FIG. 3, to vibrate (or shake) a cleaning liquid or a rinsing liquid or heat the cleaning liquid. This can help the steps (S50), (S40) and (S70) to further remove fine particles and the like on the substrate and thus allow the substrate to have a cleaner surface.

If such an apparatus as shown in FIG. 3 is used to apply an ultrasonic wave to a cleaning liquid or a rinsing liquid, the ultrasonic wave can be an ultrasonic wave of 26 kHz-38 kHz for general industrial applications, an ultrasonic wave of the 100 kHz-430 kHz band, an ultrasonic wave corresponding to a high frequency wave of the 850 kHz-2,500 kHz band, or the like.

The substrate cleaned by the cleaning method used in the method of producing a nitride-based compound semiconductor or a compound semiconductor in accordance with the present invention, as described above, is a substrate preferably having a surface roughness in Ra of 2 nm or smaller (or 3 nm or small in route-mean-square roughness Rq (RMS) as defined in JIS B0601. For a substrate having such a smooth surface, fine particles adhering thereto are particularly a concern. The above-described, present cleaning method can particularly remarkably effectively reduce fine particles adhering to the substrate.

The surface roughness of the substrate as described above can be measured with an atomic force microscope (AFM). More specifically, a square region of 4 μm×4 μm is set as a region to be measured, and its surface geometry can be measured to obtain the surface roughness of the substrate.

Furthermore the cleaning. step in each embodiment as described above can be performed with a cleaning liquid selected, as appropriate, in accordance with a material of a substrate. Furthermore, compound semiconductor can be provided with a surface roughness in such a range as above by any, conventionally known method (e.g., etching). For example, if the substrate is a GaN substrate, it is typically a substrate of a (0001) plane in a hexagonal close-packed structure. In contrast to a Si substrate, a GaN substrate has a Ga plane and an N plane formed alternately. As such, the GaN substrate has a surface with the Ga and N planes appearing. The Ga and N planes are both hardly etched. However, the N plane is relatively more etchable than the Ga plane. The Ga plane is insoluble in many types of solutions and to etch it, it needs to be heated. For cleaning a Ga substrate, a cleaning liquid based on strong acid and used to clean a Si substrate can be used. Furthermore, for the GaN substrate, HCl is used to remove oxide. Furthermore, for alkaline solution, NaOH, KOH or the like that is heated allows the GaN substrate to be etched. It should be noted, however, that if the condition of temperature is room temperature, it is difficult to use these alkaline solutions to etch the GaN substrate.

Furthermore, if the substrate is a GaAs substrate, the substrate also has a surface having Ga and As planes, and when the Ga and As planes are etched with the same etchant they are etched at different rates. The GaAs substrate can be etched with a liquid mixture of $H_2SO_4$ and $H_2O_2$ to mirror-finish its surface. Furthermore, a liquid mixture of $H_3PO_4$ and $H_2O_2$, an aqueous solution containing ammonium water and oxygenated water, or the like can also be used as etchant to etch the GaAs substrate, although it is difficult to thereby mirror-finish its surface.

Furthermore, if the substrate is an InP substrate, the substrate also has a surface with In and P planes appearing, and when the In and P planes are etched with the same etchant they are etched at different rates. As such, if the etchant is a solution of a mixture containing $HNO_3$ and HCl or that of a mixture of HCl and $H_3PO_4$, it is difficult to provide the InP substrate with a mirror-finished surface. For the InP substrate, to partially remove its surface, a solution of a mixture of $H_2SO_4$ and $H_2O_2$, that of a mixture of $Br_2$ and $CH_3OH$, or the like is used.

FIRST EXAMPLE

To confirm an effect of the method or producing a nitride-based compound semiconductor in accordance with the present invention, the following samples (ID1-ID11) were prepared and before and after a cleaning step the number of fine particles on a surface of each sample was measured. Hereinafter the prepared samples and their resultant measurements will be described.

Preparing Cleaning Liquids

Initially cleaning liquids ranging from 3 to 12 in pH were prepared. More specifically, to decrease pH, hydrochloric acid was added to pure water (pH: 6.8) to prepare a cleaning liquid. Furthermore, to increase pH, an aqueous solution of sodium hydroxide (NaOH) was added to pure water. A plurality of types of cleaning liquids different in pH were thus prepared. After acid, alkali and the like were added to pure water to provide these cleaning liquids, each cleaning liquid was sufficiently agitated and thus uniformly mixed. To maintain the cleaning liquids at a temperature of 30° C., the cleaning liquids were heated by a heater and left for 20 minutes. Note that these cleaning liquids were measured in pH with a pH concentration measuring instrument calibrated with standard liquids having a pH of 6.97 and a pH of 4.0.

Test with Samples ID1-ID11 and Result Thereof (0001), hexagonal GaN single-crystal substrates having a geometry φ of 50 mm (i.e., having a geometry in the form of a disk having a diameter of 50 mm) were then prepared. The GaN single-crystal substrates each had a surface organically decontaminated by a pre-cleaning step implemented by organic cleaning using isopropyl alcohol as a cleaning liquid. The isopropyl alcohol used in the organic cleaning was of a grade used in electronics industry. Furthermore, the cleaning liquid was set at a temperature of 35° C. and an ultrasonic wave is also applied to the cleaning liquid. With the cleaning liquid in such condition, the substrates were cleaned for 10 minutes. In the following examples, the substrates were cleaned with isopropyl alcohol basically under the same condition as described above.

Subsequently, a particle counter was used to count the number of fine particles on the surfaces of the substrates. Then in accordance with the present invention a cleaning step was performed. More specifically, the substrates were immersed in the above-described, variety of cleaning liquids and left for 10 minutes. Thereafter, the substrates were removed from the cleaning liquids and nitrogen was blown on the substrates. Then, for each substrate, a particle counter was used to measure the number of fine particles on a surface of the substrate. The result is shown in Table 1. Note that each number of fine particles is that of fine particles of 0.3 μm or larger that are detected (count/φ of 50 mm).

TABLE 1

| Group | ID | pH | Before Cleaning | After Cleaning | Variation |
|---|---|---|---|---|---|
| | | | [count/φ of 50 mm] | | |
| Comparative Example | 1 | 3.0 | 45 | 81 | 36 |
| | 2 | 5.0 | 38 | 69 | 31 |
| | 3 | 6.8 | 62 | 87 | 25 |
| | 7 | 7.0 | 53 | 69 | 16 |
| Present Example | 4 | 9.0 | 50 | 39 | −11 |
| | 5 | 11.0 | 43 | 28 | −15 |
| | 6 | 13.0 | 55 | 34 | −21 |
| | 8 | 7.1 | 52 | 39 | −13 |
| | 9 | 7.3 | 41 | 32 | −9 |
| | 10 | 7.5 | 46 | 31 | −15 |
| | 11 | 8.0 | 39 | 28 | −11 |

It is apparent from Table 1 that the cleaning liquids having a pH of 7.1 or higher allow a fine-particle count to have a negative variation. In other words, the cleaning step using a cleaning liquid having a pH of 7.1 or higher, which corresponds to the examples of the present invention, to clean a substrate, reduced the number of fine particles on a surface of the substrate.

Note that the particle counter a measurement instrument implemented by a C1 optical surface analyzer available from Candela Instruments was used to measure the number of fine particles across the entire surface of a substrate excluding an area of 3 mm from the perimeter. The measurement was. done three times for each sample and the measurements thus obtained were averaged to obtain a resultant measurement.

SECOND EXAMPLE

A test as described below was then conducted to confirm an effect of the cleaning method of the present invention that is obtained when an acidic cleaning liquid, pure water, and the like were used.

Test with Samples IDs 12 and 13 and Results Thereof

A substrate associated with sample ID1 (or a substrate cleaned with an acidic cleaning liquid) and that associated with Sample ID3 (or a substrate cleaned with pure water) were used as those for samples IDs 12 and 13, respectively. More specifically, the substrates were cleaned with an alkaline cleaning liquid adjusted with pure water and NaOH to have a pH of 8.0. More specifically, the substrates were cleaned as follows: the substrates were immersed in the alkaline cleaning liquid for 10 minutes and subsequently removed from the cleaning liquid and nitrogen was blown on the substrates. Then, the particle counter was used to count the number of fine particles on a surface of each substrate. The result is shown in Table 2.

TABLE 2

| Group | ID | pH | Before Cleaning | After Cleaning | Variation |
|---|---|---|---|---|---|
| | | | [count/φ of 50 mm] | | |
| Present Example | 12 | 3.0→8.0 | 81 | 68 | −13 |
| | 13 | 6.8→8.0 | 87 | 70 | −17 |

It is apparent from Table 2 that the cleaning with the cleaning liquid having a pH of 8.0 reduces fine particles increased in acidic cleaning, pure water cleaning, and the like.

THIRD EXAMPLE

A test as described below was then conducted to confirm an effect of the cleaning method of the present invention that is obtained after organic cleaning and acidic cleaning were performed as a pre-cleaning step.

Test with Sample ID 14 and Result Thereof

A (001), hexagonal, GaN single-crystal substrate having a geometry φ 50 mm was prepared as a substrate for a sample ID14. To remove organic contamination from a surface thereof, as a pre-cleaning step, organic cleaning is performed with isopropyl alcohol. Subsequently to examine how the surface of the substrate is contaminated by impurity, total reflection X-ray fluorescence spectrometry (TXRF) measurement was conducted. Then the particle counter was used to count the number of fine particles on the surface of the substrate. The number of fine particles was 48/φ of 50 mm. Subsequently as the pre-cleaning step the substrate was immersed in a cleaning liquid having a pH of 3.0 for 10 minutes (or the substrate underwent acidic cleaning). Subsequently the substrate was immersed in an alkaline cleaning liquid having a pH of 8.0 for 10 minutes (or underwent alkaline cleaning). The alkaline cleaning liquid was similar to that used in the second example. The substrate was then removed from the cleaning liquid and nitrogen was blown on the substrate and thereafter the substrate underwent TXRF measurement to examine how impurity was increased/decreased and furthermore the particle counter was used to measure the number of fine particles on the surface of the substrate. The TXRF measurement has revealed that Cu, Ca and Fe observed before the cleaning decreased by approximately 10 to $30 \times 10^{10}$ atoms/cm$^2$. Furthermore from the measurement obtained through the particle counter it has been confirmed that while the number of fine particles observed before the alkaline cleaning was 48/φ of 50 mm, it was reduced through the alkaline cleaning to 36/φ of 50 mm. In other words, it has been confirmed that the acidic cleaning and the subsequently performed, alkaline cleaning with a cleaning liquid having a pH of 7.1 or higher to clean a substrate reduce metallic impurity and the number of fine particles on a surface of the substrate.

FOURTH EXAMPLE

A sapphire substrate with a thin aluminum nitride film deposited thereon was prepared for a sample ID15 and the following test was conducted to confirm how effective the present cleaning method is for that sample.

Test with Sample ID15 and Result Thereof

A (0001), sapphire substrate having a diameter φ of 2 inches was subjected to RF magnetron sputtering to deposit a thin aluminum nitride (AlN) film thereon. The sputtering was performed with a target material implemented by an AlN sintered compact. An RF power of one kilowatt and an ambient gas formed of gaseous argon (Ar) and gaseous nitrogen (N) mixed together at a ratio of 1:1 were used. Furthermore, the sputtering was performed in a reactor having an internal pressure set to be one Pascal (Pa) and the temperature of the substrate was set at 890° C. On that substrate a thin AlN film was deposited to have a thickness of 1 μm.

Then the particle counter was used to count the number of fine particles of 0.3 μm or larger on a surface of the substrate (or a surface of the thin AlN film). 122 fine particles/φ 2 inches were counted. Thereafter, the substrate underwent organic cleaning with isopropyl alcohol. Subsequently, the substrate was immersed in an alkaline cleaning liquid having a pH of 8.0 for 10 minutes (or underwent alkaline cleaning). The alkaline cleaning liquid was similar to that used in the second example. The substrate was then removed from the alkaline cleaning liquid and nitrogen was blown on the substrate, and the particle counter was then used to count the number of fine particles on the surface of the thin AlN film deposited on the substrate. The number of fine particles was found to be reduced to 63/φ 2 inches. Thus it has been confirmed that the alkaline cleaning reduces the number of fine particles on the surface of the substrate.

FIFTH EXAMPLE

The following test was then conducted to confirm an effect provided when an alkaline cleaning liquid has oxidizer added thereto Test with Sample ID16 and Result Thereof The substrate associated with sample ID2 (of the substrate having undergone acidic cleaning) was prepared as that for a sample ID16. The substrate for sample ID16 was then immersed for 4 minutes in a cleaning liquid implemented by an aqueous solution of ammonium, oxygenated water serving as an oxidizer, and pure water mixed together at a ratio of 1:1:1. Thereafter the substrate was removed from the cleaning liquid and nitrogen was blown on the substrate and the particle counter was then used to count the number of fine particles on a surface of the substrate. The result shows that while the number of fine particles of 0.3 μm or larger before the cleaning was 69/φ of 50 mm, it was reduced through the cleaning to 41/φ of 50 mm. As a result, it has been found that adding an oxidizer to the alkaline cleaning liquid contributes to a reduced number of fine particles.

SIXTH EXAMPLE

The following test was conducted to confirm an effect achieved when water electrolytically obtained at a cathode is used as a cleaning liquid.

Test with Sample ID17 and Result Thereof

A (001), hexagonal, GaN single-crystal substrate having a geometry φ of 50 mm was prepared as a substrate for a sample ID17. To remove organic contamination from a surface thereof, organic cleaning was performed with isopropyl alcohol. Subsequently to examine how the surface of the substrate before alkaline cleaning is contaminated by impurity, total reflection X-ray fluorescence spectrometry (TXRF) measurement was conducted. Then the particle counter was used to count the number of fine particles of 3 μm or larger on the surface of the substrate. The number of fine particles was 51/φ of 50 mm. Subsequently, the substrate for sample ID17 was immersed for 10 minutes in a cleaning liquid formed of hydrofluoric acid, oxygenated water serving as an oxidizer, and pure water mixed together at a ratio of 1:5:20. Subsequently the substrate was cleaned with water electrolytically obtained at a cathode that is formed of $NH_4OH$ with approximately 0.1 ppm of pure water added thereto and is electrolyzed, having a pH of 8.4. In the water electrolytically obtained at a cathode the substrate was immersed in 10 minutes (or underwent alkaline cleaning) and thereafter the substrate was removed from the cleaning liquid formed of the electrolytic cathode water, and nitrogen was blown on the substrate. Thereafter TXRF measurement was conducted to examine whether impurity on the surface of the substrate was increased/decreased. As a result it has been confirmed that Cu, Ca and Fe observed before cleaning have reduced by alkaline cleaning by approximately 20 to $35 \times 10^{10}$ atoms/cm$^2$ and the number of fine particles has also been reduced from 51/φ of 50 mm by the alkaline cleaning to 30/φ of 50 mm. Thus it has been confirmed that the acidic cleaning and the subsequently performed, alkaline cleaning with water electrolytically obtained at a cathode that has a pH of 7.1 or higher have reduced metallic impurity and the number of fine particles.

SEVENTH EXAMPLE

The following test was conducted to confirm an effect provided when a cleaning liquid is ultrasonically vibrated.

Test with Sample ID18 and Result Thereof

A (001), hexagonal, GaN single-crystal substrate having a geometry φ of 50 mm was prepared as a substrate for a sample ID18 and the particle counter was used to count the number of fine particles on a surface of the substrate. Subsequently an ozone generator is employed to expose the surface of the substrate to an ultraviolet ray to remove organic contamination therefrom. More specifically, the ozone generator was employed to expose the surface of the substrate to ultraviolet ozone for 5 minutes. Subsequently the substrate was cleaned in an apparatus with pure water. Furthermore, the substrate was removed from the apparatus and immersed in a cleaning liquid formed of an alkaline solution having a pH of 8.0 (i.e., an alkaline cleaning liquid). Note that the alkaline cleaning liquid was an alkaline cleaning liquid similar to that used in the second example. Furthermore, in the cleaning, an ultrasonic wave was applied to the alkaline cleaning liquid. The applied ultrasonic wave had a frequency set to 950 kHz. Note that the ultrasonic wave was applied for example by employing ultrasonic wave generating member 3 of the cleaning apparatus shown in FIG. 3.

Thereafter the substrate was removed from the alkaline cleaning liquid and nitrogen was blown on the substrate, and the particle counter was then used to count the number of fine particles on the surface of the substrate. As a result it has been found that 99 fine particles/φ of 50 mm observed before the alkaline cleaning have been reduced to 31 fine particles/φ of 50 mm through the alkaline cleaning. That is, it has been confirmed that an ozone cleaning step exposing a substrate to an ultraviolet ray, and subsequently applying an ultrasonic wave to a cleaning liquid formed of an alkaline solution, reduces the number of fine particles on a surface of the substrate.

EIGHTH EXAMPLE

The following experiment was conducted to measure zeta potential for a fine particle having a possibility of adhering to a substrate formed of compound semiconductor. Hereinafter, how the experiment was conducted and a result thereof will be described.

Preparing Samples

Particles the zeta potential of which was to be measured were prepared as follows: Initially, two 2-inch, single-crystal GaN substrates having a hexagonal close-packed structure, two (100) GaAs substrates and two (100) InP substrates were cut out from ingots and thus prepared, and had their surfaces cleaned with water containing 5% of sulfuric acid. Subsequently, the substrates identical in material were scrubbed against each other to produce fine particles. The obtained fine particles have different sizes. Accordingly, the fine particles were sieved to extract only fine particles having a diameter of 3 μm or smaller.

Furthermore, for a reference, fine particles similarly having a diameter of 3 μm or smaller were also prepared for Si frequently used as a semiconductor substrate, $Si_3N_4$ and $SiO_2$, which are impurity, and polyethylene latex, which is resin.

Preparing Solutions

A solution to which the above described fine particles would be added was prepared as follows: more specifically, distilled water having a pH of 6.7 with HCl added thereto for adjustment in pH was provided to prepare an acidic solution. Furthermore, distilled water having the pH of 6.7 with NaOH added thereto for adjustment in pH was provided to prepare an alkaline solution. Furthermore, distilled water having the pH of 6.7 with KCl added thereto for adjustment in pH was provided to prepare a neutral solution.

Method of Measurement

Zeta potential was measured by the following method: the various types of fine particles prepared as described above were each added to each solution adjusted in pH and an electric field was externally applied to the solution. In that condition, the mobility of the fine particles was measured and a zeta potential was obtained from the intensity of the electric field and the mobility of the fine particles the mobility of the fine particles was measured with a laser Doppler velocimeter employing a He—Ne laser. The measurement was conducted at a constant temperature of 25° C. The measurement was conducted with the same pH at five points and the resultant measurements obtained for the five points (or five resultant measurements) excluding the maximum and minimum values, i.e., the data corresponding to the remaining three measurements were average out. The obtained average value was employed as the data for that pH to calculate the zeta potential. Note that the data for the above described, five resultant measurements had a variation of approximately ±0.3%.

Result

Figure 8:
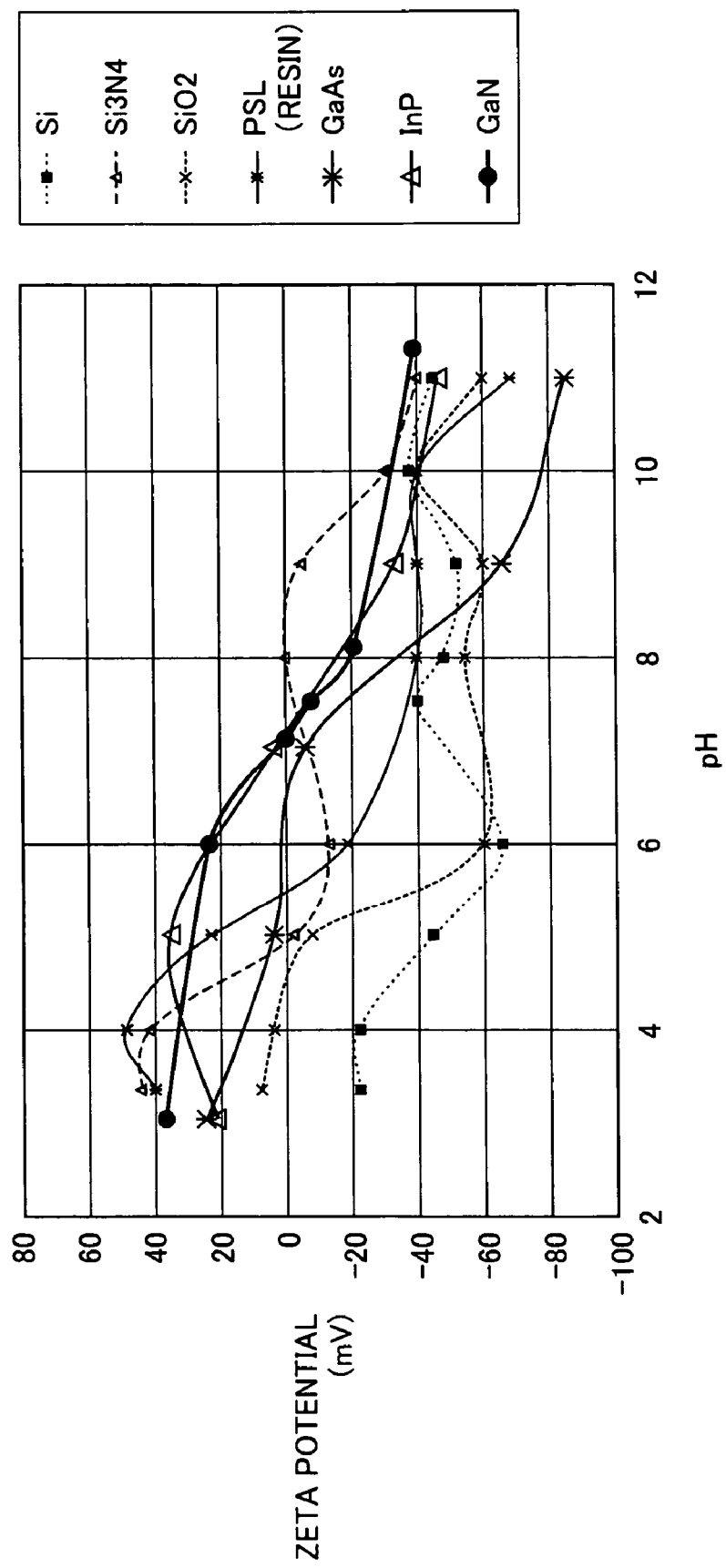
FIG. 8 is a graph representing a relationship between a solution in pH and each fine particle in zeta potential.

FIG. 8 represents a relationship between zeta potential as measured and the solutions as represented in pH for the above described, each types of fine particles. With reference to FIG. 8, the experiment provided a result, as described hereinafter.

FIG. 8 shows a graph having a horizontal axis representing the solutions as represented in pH, and a vertical axis representing zeta potential (mV). Furthermore, as shown in a legend, for each material forming fine particles, a zeta potential is represented as provided in the solutions having different pHs. As shown in FIG. 8, it can be found that for any type of fine particles, there is a tendency that zeta potential is reduced (or more negative) for solutions higher in pH (or more alkaline). In other words, the fine particles have a tendency to be more negatively charged for solutions higher in pH.

Furthermore, fine particles formed of Si, $SiO_2$ and the like provide a negative zeta potential even for a solution having a pH in an acidic range. In contrast, particles formed of GaN, GaAs, and InP do not provide a zeta potential of zero or lower unless the solution of interest has a pH higher than that for which particles of Si, $SiO_2$ and the like do. This indicates that it is preferable that a cleaning method be applied for fine particles formed of Si, $SiO_2$ and the like, and a different cleaning method be applied for those formed of GaN, GaAs, InP and the like as described above.

More specifically, as zeta potential can be regarded as a surface potential of a fine particle present in a solution, fine particles indicating zeta potentials, respectively, different in sign, will attract each other by Coulomb force. In contrast, fine particles indicating zeta potentials, respectively, identical in sign will repel each other, and as can be understood from FIG. 8, for most particles (for example those formed of $SiO_2$, PSL and the like), their zeta potential can be set to be negative by providing a solution with a pH of 5 or higher. As such, if a substrate to be cleaned is formed for example of Si, using a cleaning liquid (a solution) having a pH of 5 or higher, more preferably a pH of 5.5 or higher, still more preferably a pH of 6 or higher allows the substrate and fine particles to both have negative zeta potential. In other words, if a substrate formed of Si is to be cleaned, using a cleaning liquid having a pH set to be 5 or higher can prevent the above described fine particles from adhering to the substrate.

In contrast, if a substrate to be cleaned is formed of GaN, InP, GAs or a similar compound semiconductor, the situation is different from that for a Si substrate. As can be seen from FIG. 8, fine particles formed of GaN, InP, GaAs or the like attain negative zeta potential for approximately a pH of 7 or higher (more specifically, fine particles formed of GaN and InP attain negative zeta potential for a pH of 7 or higher, and those formed of GaAs attain such potential for a pH of 6.5 or higher). As such, if fine particles formed for example of Si, $SiO_2$ and the like are present in a cleaning liquid, and the substrate is not cleaned under a condition allowing not only the aforementioned fine particles but also the aforementioned GaN, InP, GaAs to have a negative zeta potential, fine particles formed of Si, $SiO_2$ and the like will be attracted through Coulomb force and thus adhere to a surface of the substrate (formed of GaN, InP, GaAs or the like) as it is cleaned. Accordingly, as can be seen from FIG. 8, if a cleaning liquid having a pH of 7.1 or higher is used, the surface of the substrate formed of GaN, InP, GaAs or the like and fine particles formed of Si, $SiO_2$, $Si_3N_4$, PSL and the like and present in the cleaning liquid can have zeta potentials, respectively, identical in sign (or negative zeta potentials) and furthermore, fine particles formed of GaN, InP, GaAs and the like and the surface of the substrate can have zeta potentials, respectively, identical in sign (or negative zeta potentials). The substrate can thus be prevented from having a surface with the above described fine particles attracted and thus adhering thereto through Coulomb force.

Herein, when a Si substrate that has undergone alkaline cleaning is subsequently cleaned, the substrate is typically cleaned with an acidic solution. As can be understood from FIG. 8, for an acidic solution having a pH for example of approximately 5, the Si substrate has a surface having a negative zeta potential and fine particles formed of $SiO_2$, $Si_{3N4}$ and the like also have a negative zeta potential. Accordingly, there is a small possibility that the above described fine particles are attracted by Coulomb force and thus adhere to the surface of the Si substrate. In contrast, if a GaN, InP, GaAs, or similar compound semiconductor substrate is finally cleaned with a cleaning liquid having a pH for example of approximately 5, the surface of the substrate and fine particles of $SiO_2$, $Si_3N_4$ and the like will have zeta potentials, respectively, different in sign. As a result, the above described fine particles will be attracted through Coulomb force and thus adhere to the surface of the substrate (or the surface of the substrate will be contaminated by the fine particles). Accordingly, when the above described compound semiconductor substrate is finally cleaned, it is cleaned preferably with a cleaning liquid formed of an alkaline solution (a solution having a pH of 7.1 or higher). The attraction and adhesion of fine particles to the surface of the substrate can thus be prevented.

Note that the extent to which a cleaning liquid removes foreign matters on a surface of a substrate varies with the pH, temperature and the like condition of the cleaning liquid. For example, for a GaN substrate, as can be understood from FIG. 8, finally cleaning the substrate with a cleaning liquid having a pH set to have a value of 7.1 or higher can suppress the attraction and adhesion of fine particles to a surface of the GaN substrate. However, as a precondition for this effect, setting the temperature of the cleaning liquid used to finally clean the substrate to room temperature (for FIG. 8, at least 20° C. and at most 35° C., preferably 25° C.) is included. As a matter of course, the cleaning liquid may have a temperature set to be higher than room temperature. Setting the temperature to be higher, however, changes the relationship between the cleaning liquid (or solution) represented in pH and zeta potential (i.e., such a relationship as shown in FIG. 8). Accordingly, if the temperature condition is thus changed, the substrate is preferably cleaned under such a condition that for that temperature, the material(s) forming the substrate and the material(s) forming fine particles have zeta potentials, respectively, all identical in sign (or having a negative sign). Such consideration similarly applies to substrates formed of GaAs, InP and the like.

Ninth Embodiment

A test was conducted to confirm that when a cleaning liquid has a zeta potential of at least −15 mV and at most +15 mV, ultrasonically applying vibration allows fine particles to be removed more effectively.

Preparing Cleaning Liquids and Samples

Six types of cleaning liquids falling within a range of 6 to 8 in pH were prepared. More specifically, pure water (or distilled water); having a pH of 6.8 with HCl added thereto was provided to prepare a cleaning liquid reduced in pH (or an acidic cleaning liquid). Furthermore, the above pure water with NaOH added thereto was provided to prepare a cleaning liquid increased in pH (or an acidic cleaning liquid). The cleaning liquids also had an agent added thereto. To uniformly mix the added agent and the like, the cleaning liquids were agitated for 5 minutes. The cleaning liquids were set in temperature at 30° C. These cleaning liquids were measured in pH with a pH potentiometer calibrated with standard calibration liquids having a pH of 6.97 and a pH of 4.0. The result shows that the cleaning liquids had pHs of 6.3, 6.5, 6.8, 7.6, 7.8, and 7.9, respectively.

Furthermore, 12 (0001), hexagonal GaN single-crystal substrates having an outer diameter $\phi$ of 50 mm were prepared as samples (IDs 14 to 25) to be cleaned.

Specific Content of Test

A pre-cleaning step was performed to remove foreign matters formed of organic material from the surfaces of the substrates aforementioned. In this pre-cleaning step, isopropyl alcohol was used as a cleaning liquid to clean the substrates of organic matters. The substrates were cleaned for 10 minutes with the cleaning liquid with its temperature set at 35° C. The isopropyl alcohol was of a grade used in electronics industry.

Subsequently the substrates were removed from the cleaning liquid and nitrogen was blown on the substrates. Subsequently the particle counter was used to count the number of fine particles of 0.3 μm or larger in diameter that are detected on a surface of each substrate per $\phi$ of 50 mm.

Subsequently these substrates were immersed in the above described, six types of cleaning liquids and for some samples (ID14, ID16, ID18, ID20, ID22, and ID24) an ultrasonic wave was applied to the cleaning liquids. The applied ultrasonic wave had a frequency of 950 kHz. For the other samples, the ultrasonic wave was not applied to the cleaning liquids. Under such condition, the substrates were cleaned for 10 minutes. Note that the zeta potential for a cleaning liquid having fine particles of GaN was previously measured in a manner similar to that described in the eighth example.

After the substrates were cleaned, the substrates were removed from the cleaning liquids and nitrogen was blown on the substrates. Thereafter the particle counter was employed to count the number of fine particles on a surface of each substrate. The result is shown in Table 3.

−15 mV or exceeding +15 mV in zeta potential did not provide a significant difference between variations in the numbers of fine particles after the cleaning, regardless of whether the ultrasonic wave is applied or not.

TENTH EXAMPLE

The following test was conducted to confirm an effect in a rinsing step using a rinsing liquid having a pH of at least 6.5 and at most 7.5, that is provided by ultrasonically vibrating the rinsing liquid.

Preparing Samples

Two (0001), hexagonal GaN single-crystal substrates having an outer diameter $\phi$ of 50 mm, two (100), GaAs substrates having an outer diameter $\phi$ of 2 inches, and two (100), InP substrates having an outer diameter $\phi$ of 2 inches were prepared as samples to be cleaned.

Furthermore, pure water having a pH of 6.8 with HCl added thereto was provided to prepare a cleaning liquid having a pH set to 5.

Specific Content of Test

A pre-cleaning step was performed to remove foreign matters formed of organic material from the surfaces of the substrates aforementioned. In this pre-cleaning step, isopropyl alcohol was used as a cleaning liquid to clean the substrates of organic matters. The substrates were cleaned for 10 minutes with the cleaning liquid with its temperature set at 35° C. The isopropyl alcohol was of a grade used in electronics industry.

Subsequently the substrates were immersed in the prepared cleaning liquid. having the pH of 5 for 10 minutes, and then removed from the cleaning liquid and nitrogen was blown on the substrates. Subsequently the particle counter was used to count the number of fine particles on a surface of each substrate. The result is shown in a Table 4, indicated hereinafter, at the "after cleaning liquid is introduced" column.

Subsequently the above substrates were immersed in pure water having a pH of 6.8, and for only one of the two substrates of each material, an ultrasonic wave was applied to the pure water while the substrate was immersed in the pure water. The ultrasonic wave had a frequency of 950 kHz. For the other one of the two substrates of each material, the

TABLE 3

| Group | ID | pH | Zeta Potential [mV] | Ultrasonic Wave | Before cleaning | After cleaning | Variation |
|---|---|---|---|---|---|---|---|
|  |  |  |  |  | [Count/$\phi$ of 50 mm] | | |
| Comparative | 14 | 6.3 | 18.2 | Applied | 47 | 77 | 30 |
| Examples | 15 |  |  | Not Applied | 38 | 66 | 28 |
| Present | 16 | 6.5 | 14.9 | Applied | 43 | 37 | −6 |
| Examples | 17 |  |  | Not Applied | 38 | 66 | 28 |
|  | 18 | 6.8 | 6.1 | Applied | 36 | 32 | −4 |
|  | 19 |  |  | Not Applied | 39 | 63 | 24 |
|  | 20 | 7.6 | −9.8 | Applied | 33 | 26 | −7 |
|  | 21 |  |  | Not Applied | 37 | 43 | 6 |
|  | 22 | 7.8 | −15 | Applied | 45 | 36 | −9 |
|  | 23 |  |  | Not Applied | 50 | 53 | 3 |
| Examples for | 24 | 7.9 | −17.8 | Applied | 40 | 30 | −10 |
| Reference | 25 |  |  | Not Applied | 41 | 30 | −11 |

As can be seen from Table 3, a cleaning liquid of at least −15 mV and at most +15 mV in zeta potential with an ultrasonic wave applied thereto in use allows a smaller number of fine properties than such cleaning liquid without the ultrasonic wave applied thereto does. A cleaning liquid of less than ultrasonic wave was not applied to the pure water. After each substrate was immersed in the pure water for 10 minutes, the substrate was removed from the pure water and nitrogen was blown on the substrate. Subsequently the particle counter was employed to count the number of fine particles on a surface of the substrate. The result is shown in Table 4. Note that fine particles having a diameter of 0.3 μm or larger were counted.

TABLE 4

| Substrate | After Cleaning Liquid is Introduced | Pure Water Cleaning (with ultrasonic wave applied) | Pure Water Cleaning (without ultrasonic wave applied) | Variation in Particle Count |
|---|---|---|---|---|
| | | [count/φ of 50 mm] | | |
| GaN | 36 | 32 | | −4 |
| | 39 | | 63 | 24 |
| GaAs | 13 | 9 | | −4 |
| | 12 | | 17 | 5 |
| InP | 52 | 45 | | −7 |
| | 48 | | 55 | 7 |

As can be understood from Table 4, when the ultrasonic is applied, a smaller number of fine particles is achieved than when the ultrasonic wave is not applied.

Hereinafter, examples of the present invention are enumerated and thus described, although some overlap the above described examples.

The present invention provides a method of cleaning a nitride-based compound semiconductor including the step of preparing a nitride-based compound semiconductor (the substrate preparation step (S10)) and the cleaning step (S20), as shown in FIGS. 1 and 2. In the cleaning step (S20), as shown in FIG. 3, a cleaning liquid 11 having a pH of 7.1 or higher is employed to clean a nitride-based compound semiconductor (or a substrate 9).

The present inventors have ardently studied a method of reducing the number of fine particles adhering on a surface of a nitride-based compound semiconductor, and have reached a conclusion that adjusting a cleaning liquid in hydrogen ion concentration (in pH) is effective in reducing fine particles adhering on the surface of the semiconductor, and thus accomplished the present invention. More specifically, in accordance with the present invention, a cleaning liquid having a pH of 7.1 or higher can be used to perform a cleaning step to reduce the number of fine particles adhering on the surface of the nitride-based compound semiconductor.

In the above described cleaning method the cleaning step (S20) is performed with the cleaning liquid that preferably contains at least one selected from the group consisting of an alkaline solution, an organic alkaline solvent, and an electrolyzed ion water. By employing such a cleaning liquid as described above, a cleaning step using a cleaning liquid having a pH of 7.1 or higher can be readily performed. Note that while the cleaning liquid may be any one of the alkaline solution, the organic alkaline solvent and the electrolyzed ion water as aforementioned, the cleaning liquid may be two or more thereof combined together. Furthermore, the cleaning liquid may contain any of the aforementioned three types of liquids as a main component and also have another component added thereto.

Furthermore, the aforementioned organic alkaline solvent (or an organic alkaline solution) is for example an aqueous solution of amine. This aqueous solution of amine can for example be aqueous solutions of amines, as indicated below:

Examples of Amines ethylhydroxylamine ($C_2H_5ONH_2$), 2-ethoxyethylamine ($C_2H_5OCH_2CH_2NH_2$), triethanolamine (($HOCH_2CH_2)_3N$), diethanolamine (($HOCH_2CH_2)_2NH$), ethylamine ($C_2H_5NH_2$), trimethylamine (($CH_3)_3N$), diethylamine (($C_2H_5)_2NH$), dimethylamine (($CH_3)_2NH$), ethanolamine ($HOCH_2CH_2NH_2$), trimethyl(2-hydroxymethyl) ammonium hydroxide: (choline) (($CH_3)_3N^+CH_2CH_2OH.OH^-$), tetraethyl ammonium hydroxide ($(C_2H_5)_4N^+.OH^-$), tetramethyl ammonium hydroxide (($CH_3)_4N^+.OH^-$).

Electrolyzed ion water refers to water produced by electrolyzing water containing ions. More specifically, if ion containing water is electrolyzed, then at an anode, acidic and oxidizing water can be produced, and at a cathode, an alkaline and reducing water can be produced. In the present invention the cleaning step (S20) is performed preferably with a cleaning liquid implemented by the alkaline water produced at the cathode.

In the above described cleaning method the cleaning liquid used in the cleaning step (S20) may have an oxidizer added thereto. In that case the cleaning step (S20) ensures that nitride-based compound semiconductor can have a surface with impurity removed therefrom, and the cleaning step (S20) can also suppress the adhesion of fine particles on the surface of the nitride-based compound semiconductor thus cleaned.

In the above cleaning method at the cleaning step (S20) it is preferable that at least one of applying an ultrasonic wave to the cleaning liquid and shake the cleaning liquid be introduced. This further ensures that the adhesion of fine particles on the surface of the nitride-based compound semiconductor thus cleaned is suppressed.

In the above cleaning method such an apparatus as shown for example in FIG. 3 is preferably used to apply at least one of an ultrasonic wave and shaking to the cleaning liquid to vibrate the cleaning liquid. Furthermore, the ultrasonic wave applied to the cleaning liquid can be an ultrasonic wave of 26 kHz-38 kHz for general industrial applications, an ultrasonic wave of the 100 kHz-430 kHz band, an ultrasonic wave corresponding to a high frequency wave of the 850 kHz-2,500 kHz band, or the like. Note that to reduce fine particles, an ultrasonic wave having a higher frequency is preferably applied to the cleaning liquid. Furthermore, if the cleaning liquid with the ultrasonic wave applied, or being vibrated, is heated and thus increased in temperature, fine particles can be removed more effectively.

The above described cleaning method may further include a pre-cleaning step (S40) cleaning the nitride-based compound semiconductor prior to the cleaning step (S20), as shown in FIG. 2. The pre-cleaning step (S40) and the cleaning step (S20) using the cleaning liquid having the pH of 7.1 or higher that are combined together allow the nitride-based compound semiconductor to have a surface with impurity removed therefrom, and also further ensure that the adhesion of fine particles on the surface of the nitride-based compound semiconductor thus cleaned is suppressed. More specifically, the present inventors have obtained a finding that as well as the pH of the cleaning liquid, the order of cleaning is also important. More specifically, performing the pre-cleaning step and finally performing the cleaning step of the present invention is effective in reducing the number of fine particles.

In the above described cleaning method the pre-cleaning step (S40) is performed preferably with at least one of pure water, an organic solvent, an acidic solution, electrolyzed ion water and an alkaline solution as the cleaning liquid. In that case, the cleaning liquid can be selected to match a property of an impurity to be removed from the surface of the nitride-based compound semiconductor in the pre-cleaning step to effectively remove the impurity from the surface. After such a pre-cleaning step is performed, the cleaning step of the present invention can be performed to remove impurity and also suppress the adhesion of fine particles on the surface of the nitride-based compound semiconductor thus cleaned. Note that the pre-cleaning step (S40) may be performed by combining two or more (or a plurality) of cleaning steps using a cleaning liquid as described above. Furthermore, the electrolyzed ion water used as a cleaning liquid in the pre-cleaning step (S40) is obtained in a method basically similar to that of producing electrolyzed ion motor used in the above described cleaning step (S20). It should be noted, however, that the electrolyzed ion water used in the pre-cleaning step (S40) as a cleaning liquid is not limited to alkaline water produced at a cathode (or alkaline, electrolyzed ion water) and may be acidic water produced at an anode (or acidic, electrolyzed ion water).

In the above described cleaning method when pure water is used as a cleaning liquid in the pre-cleaning step (S40) the cleaning liquid or the pure water may have added thereto at least one selected from the group consisting of hydrogen, ozone and carbonic acid gas. This allows the pre-cleaning step (S40) to more effectively remove impurity.

In the above described cleaning method when an acidic solution is employed as a cleaning liquid in the pre-cleaning step (S40) the cleaning liquid or the acidic solution may have an oxidizer added thereto. This can activate the cleaning liquid to allow the pre-cleaning step to more effectively remove impurity.

In the above described cleaning method at the pre-cleaning step (S40) preferably such an apparatus as shown fro example in FIG. 3 is employed to at least one of applying an ultrasonic wave to the cleaning liquid and shaking the cleaning liquid. Note that the pre-cleaning step can also be performed such that an ultrasonic wave of 26 kHz-38 kHz for general industrial applications, an ultrasonic wave of the 100 kHz-430 kHz band, an ultrasonic wave corresponding to a high frequency wave of the 850 kHz-2,500 kHz band, or the like is applied to the cleaning liquid. Furthermore, the vessel holding the cleaning liquid may be swung to vibrate the cleaning liquid, or the substrate, the substrate holder and the like immersed in the cleaning liquid may be swung to shake the cleaning liquid. Furthermore, if the cleaning liquid with an ultrasonic wave applied thereto is increased in temperature the cleaning liquid can more effectively remove impurity.

In the above described cleaning method the pre-cleaning step (S40) may include an ultraviolet ozone cleaning step. In that case the ultraviolet ozone cleaning step can remove an organic contaminant acting as impurity on a surface of a nitride-based compound semiconductor. Consequently from the surface fine particles are more readily removed. This can reduce impurity and fine particles on the surface of the nitride-based compound semiconductor that are found after it is thus cleaned.

In the above described cleaning method the nitride-based compound semiconductor may be any of bulk crystal and thin film. In that case, the present cleaning method can be used to reduce impurity and fine particles on any of a surface of the bulk crystal and that of the thin film. Note that the thin film means thin film deposited on a substrate, e.g., a substrate formed of sapphire or a similar material different from the nitride-based compound semiconductor.

In the above described cleaning method the nitride-based compound semiconductor is formed of GaN, AlN, InN or a similar III-V group nitride-based compound semiconductor, AlGaN, InGaN or a similar ternary or higher compound or the like in combination. Furthermore, the nitride-based compound semiconductor may be formed of the above described materials (e.g., that of the substrate or in the form of thin film) that are doped with impurity.

The above described cleaning method includes, other than the above described cleaning step (S20), another cleaning step (the pre-cleaning step (S40)), and the cleaning step (S20) is preferably performed after another cleaning step (the pre-cleaning step (S40)) as a final cleaning step. In that case, the cleaning step (S20) of the present invention that is performed as the final step can effectively reduce the number of fine particles that finally remain on a surface of the nitride-based compound semiconductor.

In the above described cleaning method the cleaning step (S20) performed with the cleaning liquid such that its temperature is increased can more effectively remove fine particles on the surface of the nitride-based compound semiconductor. Note that the cleaning liquid can be increased in temperature not only in the cleaning step (S20) but also the preceding, pre-cleaning step (S40) to more effectively remove impurity.

The present invention provides a method of producing a nitride-based compound semiconductor including the steps, as shown in FIG. 1 or 2, of: performing the above described method of cleaning a nitride-based compound semiconductor (i.e., the step of performing the cleaning method including the substrate preparation step (S10) and the cleaning step (S20)); and, after the step of performing the above described method of cleaning, performing a process to deposit film on the nitride-based compound semiconductor (the post-processing step (S30)). Thus the nitride-based compound semiconductor can first have a surface having a clean condition as the adhesion of fine particles thereon is suppressed, and then be subjected to the process to deposit film thereon. This allows the nitride-based compound semiconductor to have a surface with a film having stable quality deposited thereon.

The present invention provides a method of cleaning a compound semiconductor including the step of preparing a compound semiconductor (or the substrate preparation step (S10)) and the cleaning step (S50). The cleaning step (S50) is performed with a cleaning liquid to clean the compound semiconductor. The cleaning liquid is adjusted to allow fine particles formed of the same material(s) as the compound semiconductor to have a zeta potential smaller than zero such that the fine particles are contained in the cleaning liquid.

The present inventors have ardently studied cleaning of compound semiconductor and as a result have accomplished the present invention. More specifically, the present inventors have obtained a finding that using a cleaning liquid adjusted to provide a zeta potential smaller than zero, as described above, to clean a compound semiconductor can suppress the adhesion of fine particle on a surface of the compound semiconductor. The thus cleaned compound semiconductor can have a surface improved in quality. This allows a compound semiconductor film excellent in quality to be deposited on the surface of the compound semiconductor.

In the above described method of cleaning a compound semiconductor, the compound semiconductor may be InP and the cleaning liquid may be adjusted to have a pH of 7.1 or higher to have a zeta potential smaller than zero. Furthermore, from a different point of view, the present invention provides a method of cleaning a compound semiconductor including the step of preparing a compound semiconductor formed of InP (the substrate preparation step (S10)) and the cleaning step (S50). The cleaning step (S50) is performed with a cleaning liquid having a pH of 7.1 or higher to clean the compound semiconductor. Using the cleaning liquid having the pH of 7.1 or higher ensures that the adhesion of fine particles on a surface for example of a substrate formed of InP (indium phosphide) thus cleaned is suppressed.

In the above described method of cleaning a compound semiconductor, the compound semiconductor may be GaAs and the cleaning liquid may be adjusted to have a pH of 5.7 or higher to have a zeta potential smaller than zero. Furthermore, from a different point of view, the present invention provides a method of cleaning a compound semiconductor including the step of preparing a compound semiconductor formed of GaAs and a cleaning step. The cleaning step is performed with a cleaning liquid having a pH of 5.7 or higher to clean the compound semiconductor. This ensures that the adhesion of fine particles on a surface for example of a substrate formed of GaAs (gallium arsenide) thus cleaned is suppressed.

The above described method of cleaning a compound semiconductor may further include the pre-cleaning step (S40) cleaning the compound semiconductor prior to the cleaning step (S50). The pre-cleaning step (S40) and the cleaning step (S50) using the cleaning liquid reduced in zeta potential to be smaller than zero that are combined together allow the compound semiconductor to have a surface with impurity removed therefrom, and also further ensure that the adhesion of fine particles on the surface of the compound semiconductor thus cleaned is suppressed. More specifically, the present inventors have obtained a finding that as well as the zeta potential of the cleaning liquid, the order of cleaning is also important. More specifically, performing the pre-cleaning step and finally performing the cleaning step of the present invention is effective in reducing the number of fine particles.

In the above described method of cleaning a compound semiconductor the pre-cleaning step (S40) is performed preferably with at least one of pure water, an organic solvent, an acidic solution, electrolyzed ion water and an alkaline solution as the cleaning liquid. In that case, the cleaning liquid can be selected to match a property of an impurity to be removed from the surface of the compound semiconductor in the pre-cleaning step (S40) to effectively remove the impurity from the surface. After such a pre-cleaning step is performed, the cleaning step of the present invention can be performed to remove impurity and also suppress the adhesion of fine particles on the surface of the compound semiconductor thus cleaned.

In the above described method of cleaning a compound semiconductor when pure water is used as a cleaning liquid in the pre-cleaning step the cleaning liquid implemented by the pure water may have added thereto at least one selected from the group consisting of hydrogen, ozone and carbonic acid gas. This allows the pre-cleaning step to more effectively remove impurity.

In the above described method of cleaning a compound semiconductor when an acidic solution is employed as a cleaning liquid in the pre-cleaning step (S40) the cleaning liquid implemented by the acidic solution may have an oxidizer added thereto This can activate the cleaning liquid to allow the pre-cleaning step to more effectively remove impurity.

In the above described method of cleaning a compound semiconductor at the pre-cleaning step (S40) preferably such an apparatus as shown fro example in FIG. 3 is employed to at least one of applying an ultrasonic wave to the cleaning liquid and shaking the cleaning liquid. Note that the pre-cleaning step can also be performed such that an ultrasonic wave of 26 kHz-38 kHz for general industrial applications, an ultrasonic wave of the 100 kHz-430 kHz band, an ultrasonic wave corresponding to a high frequency wave of the 850 kHz-2,500 kHz band, or the like is applied to the cleaning liquid. Furthermore, the vessel holding the cleaning liquid may be swung to vibrate the cleaning liquid, or the substrate, the substrate holder and the like immersed in the cleaning liquid may be swung to shake the cleaning liquid. Furthermore, if the cleaning liquid with an ultrasonic wave applied thereto is increased in temperature the cleaning liquid can more effectively remove impurity.

In the above described method of cleaning a compound semiconductor the pre-cleaning step (S40) may include an ultraviolet ozone cleaning step. In that case the ultraviolet ozone cleaning step can remove an organic contaminant acting as impurity on a surface of a compound semiconductor. Consequently from the surface fine particles fare more readily removed. This can reduce impurity and fine particles on the surface of the compound semiconductor that are found after it is thus cleaned.

In the above described method of cleaning a compound semiconductor the compound semiconductor may be any of bulk crystal and thin film. In that case, the present cleaning method can be used to reduce impurity and fine particles on any of a surface of the bulk crystal and that of the thin film.

The present invention provides a method of cleaning a compound semiconductor including the step of preparing a compound semiconductor (the substrate preparation step (S10)) and the cleaning step (S60). The cleaning step (S60) is performed with a cleaning liquid vibrated to clean the compound semiconductor. The cleaning liquid is adjusted to allow fine particles identical in material to the compound semiconductor to have a zeta potential falling within a range of at least −15 μm to at most +15 μm such that the fine particles are contained in the cleaning liquid. Thus using the cleaning liquid adjusted to fall within the above described zeta potential range to clean the compound semiconductor can effectively suppress the adhesion of fine particles on a surface of the compound semiconductor thus cleaned.

The above described method of cleaning a compound semiconductor further includes a rinsing step (S70). The rinsing step (S70) is performed after the cleaning step with a rinsing liquid adjusted to have a pH of at least 6.5 and at most 7.5 and vibrated to rinse a surface of the compound semiconductor. The rinsing liquid is any one selected from pure water, electrolyzed ion water, and a solution having gas, liquid and/or the like added thereto (i.e., an additive-containing, aqueous solution).

The present invention provides a method, of cleaning a compound semiconductor including the step of preparing a compound semiconductor (the substrate preparation step (S10)), the cleaning step (S60), and the rinsing step (S70). In the cleaning step a cleaning liquid is used to clean the compound semiconductor. The rinsing step (S70) is performed after the cleaning step with a rinsing liquid adjusted to have a pH of at least 6.5 and at most 7.5 and vibrated to rinse a surface of the compound semiconductor. The rinsing liquid is any one selected from pure water, electrolyzed ion water, and a solution having gas, liquid and/or the like added thereto (i.e., an additive-containing, aqueous solution). Thus rinsing step (S70) following the cleaning step ensures that the adhesion of fine particles on a surface of the compound semiconductor is suppressed.

The present invention provides a method of producing a compound semiconductor including the step of: performing the method of cleaning a compound semiconductor, as described above (i.e., the step of performing the cleaning method including the substrate preparation step (S10) and the cleaning step (S50, S60)); and the step, performed after the step of performing the cleaning method, of performing a process to deposit film on the compound semiconductor (the post-processing step (S30)). Thus the compound semiconductor can first have a surface having a clean condition as fine particles adhering thereon is reduced, and then be subjected to the process to deposit the film thereon. The compound semiconductor can thus have deposited thereon a surface having stable quality.

In accordance with the present invention, substrate 9 is a substrate that is formed of a compound semiconductor clean in the above described method of cleaning a compound semiconductor and has a surface roughness in Ra of 2 nm or smaller. For substrate 9 having a thus smooth surface and subjected to the present cleaning method, the adhesion of fine particles thereon is particularly significantly effectively suppressed.

Thus the present invention can be applied to a process for producing a nitride-based compound semiconductor or a similar compound semiconductor to reduce the number of fine particles on a surface of the compound semiconductor. As a result, a process such as that for depositing a film on the surface of the compound semiconductor can be performed under an improved condition. Furthermore the present cleaning method is applicable when it is necessary to clean a surface of a compound semiconductor (i.e., reduce fine particles thereon) (e.g., when it is necessary to remove fine particles from the surface of the compound semiconductor with high precision for a process which involves measuring the surface with precision and is negatively affected by the presence of fine particles, and the like).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of cleaning a nitride-based compound semiconductor, comprising the steps of:
   preparing a nitride-based compound semiconductor; and
   cleaning said nitride-based compound semiconductor with a cleaning liquid having a pH of at least 7.1,
   wherein in the step of cleaning, at least one of applying an ultrasonic wave to said cleaning liquid and vibrating said cleaning liquid is performed.

2. The method of cleaning a nitride-based compound semiconductor according to claim 1, wherein said cleaning liquid used in the step of cleaning includes at least one selected from the group consisting of an alkaline solution, an organic alkaline solvent, and electrolyzed ion water.

3. The method of cleaning a nitride-based compound semiconductor according to claim 1, wherein said cleaning liquid used in the step of cleaning has an oxidizer added thereto.

4. The method of cleaning a nitride-based compound semiconductor according to claim 1, wherein said nitride-based compound semiconductor is any of bulk crystal and thin film.

5. A method of producing a nitride-based compound semiconductor, comprising the steps of:
   performing the method of cleaning a nitride-based compound semiconductor, as recited in claim 1; and
   after the step of performing the method of cleaning, performing a process to deposit a film on said nitride-based compound semiconductor.

6. The method of cleaning a nitride-based compound semiconductor according to claim 1, further comprising, prior to the step of cleaning, the step of pre-cleaning said nitride-based compound semiconductor.

7. The method of cleaning a nitride-based compound semiconductor according to claim 6, wherein the step of pre-cleaning includes an ultraviolet ozone cleaning step.

8. The method of cleaning a nitride-based compound semiconductor according to claim 6, wherein the step of pre-cleaning employs, as a cleaning liquid, at least one of pure water, an organic solvent, an acidic solution, electrolyzed ion water, and an alkaline solution.

9. The method of cleaning a nitride-based compound semiconductor according to claim 8, wherein said pure water used as a cleaning liquid in the step of pre-cleaning has added thereto at least one selected from the group consisting of hydrogen, ozone and carbonic acid gas.

10. The method of cleaning a nitride-based compound semiconductor according to claim 8, wherein said acidic solution used as a cleaning liquid in the step of pre-cleaning has an oxidizer added thereto.

11. A method of cleaning a compound semiconductor, comprising the steps of:
    preparing a compound semiconductor; and
    cleaning said compound semiconductor with a cleaning liquid, wherein said cleaning liquid is adjusted to allow fine particles identical in material to said compound semiconductor to have a zeta potential smaller than zero such that said fine particles are contained in said cleaning liquid.

12. The method of cleaning a compound semiconductor according to claim 11, wherein said compound semiconductor is any of bulk crystal and thin film.

13. A method of producing a compound semiconductor, comprising the steps of:
    performing the method of cleaning a compound semiconductor, as recited in claim 11; and
    after the step of performing the method of cleaning, performing a process to deposit a film on said compound semiconductor.

14. The method of cleaning a compound semiconductor according to claim 11, further comprising, prior to the step of cleaning, the step of pre-cleaning said compound semiconductor.

15. The method of cleaning a compound semiconductor according to claim 14, wherein the step of pre-cleaning includes an ultraviolet ozone cleaning step.

16. The method of cleaning a compound semiconductor according to claim 14, wherein the step of pre-cleaning employs, as a cleaning liquid, at least one of pure water, an organic solvent, an acidic solution, electrolyzed ion water, and an alkaline solution.

17. The method of cleaning a compound semiconductor according to claim 16, wherein said pure water used as a cleaning liquid in the step of pre-cleaning has added thereto at least one selected from the group consisting of hydrogen, ozone and carbonic acid gas.

18. The method of cleaning a compound semiconductor according to claim 16, wherein said acidic solution used as a cleaning liquid in the step of pre-cleaning has an oxidizer added thereto.

19. A substrate formed of a compound semiconductor cleaned in the method of cleaning a compound semiconductor, as recited in claim 11, said substrate having a surface roughness in Ra of at most 2 nm.

20. The substrate as recited in claim 19, wherein the substrate after the cleaning has a smaller number of the fine particles adhering to a surface of the substrate than before cleaning.

21. The substrate as recited in claim 19, wherein after the substrate is cleaned the number of the fine particles adhered to a surface having a zeta potential in the cleaning liquid identical in sign to the substrate is smaller than that of such fine particles adhered to a surface of the substrate before cleaning.

22. A method of cleaning a compound semiconductor, comprising the steps of:
    preparing a compound semiconductor formed of InP;

cleaning said compound semiconductor with a cleaning liquid having a pH of at least 7.1; and prior to the step of cleaning, pre-cleaning said compound semiconductor, wherein the pre-cleaning employs, as a cleaning liquid, at least one of pure water, an organic solvent, an acidic solution, electrolyzed ion water, and an alkaline solution, and said pure water used as a cleaning liquid in the pre-cleaning has added thereto at least one selected from the group consisting of hydrogen, ozone and carbonic acid gas.

23. The method of cleaning a compound semiconductor according to claim 22, wherein said compound semiconductor is any of bulk crystal and thin film.

24. A method of producing a compound semiconductor, comprising the steps of:

performing the method of cleaning a compound semiconductor, as recited in claim 22; and after the step of performing the method of cleaning, performing a process to deposit a film on said compound semiconductor.

25. A substrate formed of a compound semiconductor cleaned in the method of cleaning a compound semiconductor, as recited in claim 22, said substrate having a surface roughness in Ra of at most 2 nm.

26. The substrate as recited in claim 25, wherein the substrate after the cleaning has a smaller number of the fine particles adhering to a surface of the substrate than before cleaning.

27. The substrate as recited in claim 25, wherein after the substrate is cleaned the number of the fine particles adhered to a surface having a zeta potential in the cleaning liquid identical in sign to the substrate is smaller than that of such fine particles adhered to a surface of the substrate before cleaning.

28. A method of cleaning a compound semiconductor, comprising the steps of:

preparing a compound semiconductor formed of InP; and cleaning said compound semiconductor with a cleaning liquid having a pH of at least 7.1; and prior to the step of cleaning, pre-cleaning said compound semiconductor, wherein the step of pre-cleaning includes an ultraviolet ozone cleaning step.

29. The method of cleaning a compound semiconductor according to claim 28, wherein said compound semiconductor is any of bulk crystal and thin film.

30. A method of producing a compound semiconductor, comprising the steps of:

performing the method of cleaning a compound semiconductor, as recited in claim 28; and after the step of performing the method of cleaning, performing a process to deposit a film on said compound semiconductor.

31. A method of cleaning a compound semiconductor, comprising the steps of:

preparing a compound semiconductor formed of GaAs;

cleaning said compound semiconductor with a cleaning liquid having a pH of at least 5.7; and prior to the step of cleaning, pre-cleaning said compound semiconductor, wherein the pre-cleaning employs, as a cleaning liquid, at least one of pure water, an organic solvent, an acidic solution, electrolyzed ion water, and an alkaline solution, and said pure water used as a cleaning liquid in the pre-cleaning has added thereto at least one selected from the group consisting of hydrogen, ozone and carbonic acid gas.

32. The method of cleaning a compound semiconductor according to claim 31, wherein said compound semiconductor is any of bulk crystal and thin film.

33. A method of producing a compound semiconductor, comprising the steps of:

performing the method of cleaning a compound semiconductor, as recited in claim 31; and after the step of performing the method of cleaning, performing a process to deposit a film on said compound semiconductor.

34. A substrate formed of a compound semiconductor cleaned in the method of cleaning a compound semiconductor, as recited in claim 31, said substrate having a surface roughness in Ra of at most 2 nm.

35. The substrate as recited in claim 34, wherein the substrate after the cleaning has a smaller number of the fine particles adhering to a surface of the substrate than before cleaning.

36. The substrate as recited in claim 34, wherein after the substrate is cleaned the number of the fine particles adhered to a surface having a zeta potential in the cleaning liquid identical in sign to the substrate is smaller than that of such fine particles adhered to a surface of the substrate before cleaning.

37. A method of cleaning a compound semiconductor, comprising the steps of:

preparing a compound semiconductor formed of GaAs;

cleaning said compound semiconductor with a cleaning liquid having a pH of at least 5.7, and prior to the step of cleaning, pre-cleaning said compound semiconductor, wherein the step of pre-cleaning includes an ultraviolet ozone cleaning step.

38. The method of cleaning a compound semiconductor according to claim 37, wherein said compound semiconductor is any of bulk crystal and thin film.

39. A method of producing a compound semiconductor, comprising the steps of:

performing the method of cleaning a compound semiconductor, as recited in claim 37; and after the step of performing the method of cleaning, performing a process to deposit a film on said compound semiconductor.

40. A method of cleaning a compound semiconductor, comprising the steps of:

preparing a compound semiconductor; and cleaning said compound semiconductor with a cleaning liquid, wherein:

said cleaning liquid is adjusted to allow fine particles identical in material to said compound semiconductor to have a zeta potential falling within a range of −15 mV to +15 mV, both inclusive, such that said fine particles are contained in said cleaning liquid; and in the step of cleaning, said compound semiconductor is cleaned with said cleaning liquid vibrated.

41. A method of producing a compound semiconductor, comprising the steps of:

performing the method of cleaning a compound semiconductor, as recited in claim 40; and after the step of performing the method of cleaning, performing a process to deposit a film on said compound semiconductor.

42. A substrate formed of a compound semiconductor cleaned in the method of cleaning a compound semiconductor, as recited in claim 40, said substrate having a surface roughness in Ra of at most 2 nm.

43. The substrate as recited in claim 42, wherein the substrate after the cleaning has a smaller number of the fine particles adhering to a surface of the substrate than before cleaning.

44. The substrate as recited in claim 42, wherein after the substrate is cleaned the number of the fine particles adhered to a surface having a zeta potential in the cleaning liquid identical in sign to the substrate is smaller than that of such fine particles adhered to a surface of the substrate before cleaning.

* * * * *